United States Patent
Grollitsch (10) Patent No.: US 8,264,261 B2
(45) Date of Patent: Sep. 11, 2012

(54) METHOD AND APPARATUS FOR THE CONTROLLED DELAY OF AN INPUT SIGNAL

(75) Inventor: Werner Grollitsch, Villach (AT)

(73) Assignee: Infineon Technologies AG, Neubiberg (DE)

( * ) Notice: Subject to any disclaimer, the term of this patent is extended or adjusted under 35 U.S.C. 154(b) by 56 days.

(21) Appl. No.: 12/891,972

(22) Filed: Sep. 28, 2010

(65) Prior Publication Data

US 2011/0074480 A1  Mar. 31, 2011

(30) Foreign Application Priority Data

Sep. 28, 2009 (DE) .................. 10 2009 043 315

(51) Int. Cl.
*H03L 7/06* (2006.01)

(52) U.S. Cl. ....................... 327/158; 327/149

(58) Field of Classification Search .................. 327/149, 327/158

See application file for complete search history.

(56) References Cited

U.S. PATENT DOCUMENTS

| | | | |
|---|---|---|---|
| 5,287,025 A | 2/1994 | Nishimichi | |
| 6,600,355 B1 * | 7/2003 | Nguyen | 327/298 |
| 7,392,446 B1 * | 6/2008 | Simmons et al. | 714/725 |
| 7,444,559 B2 * | 10/2008 | Swanson et al. | 714/718 |
| 7,495,488 B2 * | 2/2009 | Kim | 327/159 |
| 7,583,102 B1 * | 9/2009 | Simmons et al. | 326/38 |
| 2006/0284656 A1 | 12/2006 | Yu et al. | |
| 2007/0205816 A1 * | 9/2007 | Kim | 327/156 |
| 2008/0192563 A1 | 8/2008 | Cho | |
| 2010/0039157 A1 * | 2/2010 | Kaeriyama et al. | 327/292 |
| 2011/0074480 A1 * | 3/2011 | Grollitsch | 327/158 |
| 2012/0056652 A1 * | 3/2012 | Lai et al. | 327/157 |

* cited by examiner

*Primary Examiner* — Lincoln Donovan
*Assistant Examiner* — Adam Houston
(74) *Attorney, Agent, or Firm* — Eschweiler & Associates, LLC (57) ABSTRACT

An apparatus for the controlled delay of an input signal includes a signal input for receiving an input signal. The input signal is supplied to a delay line with a multiplicity of delay elements. Outputs of the delay elements allow respective differently delayed phase signals to be tapped off. Furthermore, a register line with a multiplicity of register elements is provided. The register elements are each associated with one of the delay elements. Each of the register elements has a reset input and a clock input. The reset inputs are coupled to the signal input. The outputs of the delay elements are each coupled to the clock input of the register element associated therewith.

20 Claims, 8 Drawing Sheets

METHOD AND APPARATUS FOR THE CONTROLLED DELAY OF AN INPUT SIGNAL

CROSS REFERENCE TO RELATED APPLICATIONS

This application claims priority to German Patent Application No. 102009043315.5 filed on Sep. 28, 2009, the contents of which are herein incorporated by reference in their entirety.

TECHNICAL FIELD

The present invention relates to apparatuses and methods for the controlled delay of an input signal.

BACKGROUND

In various fields of application, delay locked loops (also called DLLs) are used. The delay of an input clock signal is typically locked in the delay locked loop such that the delayed input clock signal is delayed by precisely one clock cycle relative to the input clock signal. This is typically done by comparing the signal edges of the input clock signal and of the delayed input clock signal using a phase frequency detector. If the adjusted delay of the delay locked loop is too great, however, it may arise that the delay locked loop is locked for a delay of two or more clock cycles. An incorrect lock state of this kind in the delay locked loop is also called a false lock state.

There is therefore a need for efficient techniques for sensing a false lock state in a delay locked loop.

SUMMARY

In line with one exemplary embodiment of the invention, an electronic apparatus is provided which comprises a signal input for receiving an input signal and a delay line for delaying the input signal. The delay line comprises at least two delay elements which allow differently delayed phase signals to be tapped off therefrom. Furthermore, the apparatus comprises a register line. The register line comprises, for the delay elements, a respective appropriate register element with a reset input and a clock input. A reset signal supplied to the reset inputs is derived from the input signal. The phase signals from the delay elements are each supplied to the clock input of the relevant register element.

Further features of exemplary embodiments of the invention and accompanying advantages can be found in the detailed description below with reference to the appended drawings.

DETAILED DESCRIPTION

The detailed description which follows explains exemplary embodiments of the invention which relate to apparatuses and methods for the controlled delay of an input signal. The apparatuses may be delay locked loops (DLLs). The input signal may be a clock signal. However, it may also be a pulsed signal which comprises a series of pulses but is not completely periodic. In the description which follows, however, an input signal in the form of a completely periodic clock signal is assumed, this being called an input clock signal. The designs described below relate particularly to the sensing of a false lock state in a delay locked loop. Such a delay locked loop can be used, by way of example, to produce a plurality of phase signals with an even phase interval from the input clock signal. These phase signals can in turn be combined with one another in various ways in order to produce an output clock signal with a different frequency and/or phase than the input clock signal. Such frequency synthesis can be used, by way of example, in communication apparatuses, such as modems or mobile radios. Many other application options are also conceivable, however.

Figure 1:
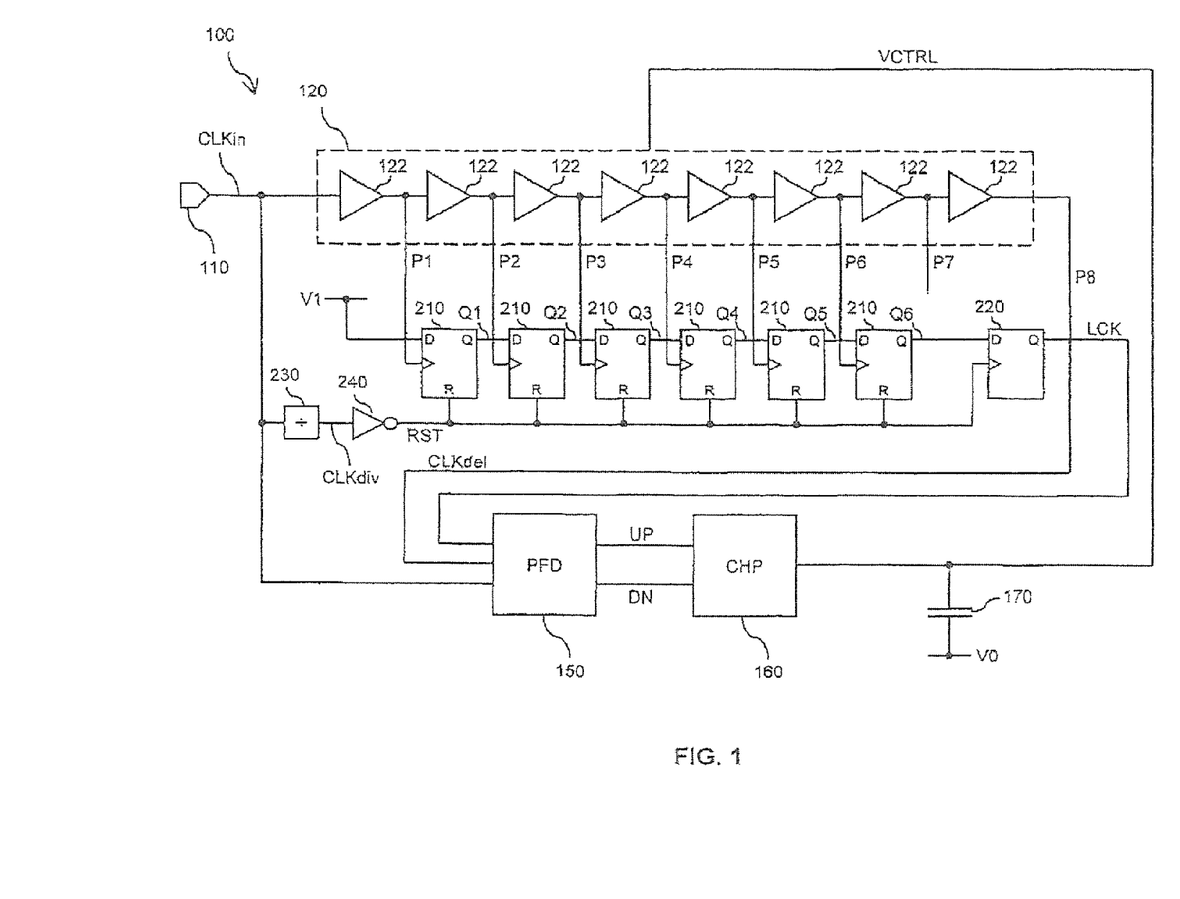
FIG. 1 schematically shows a delay locked loop in accordance with an exemplary embodiment of the invention.

FIG. 1 schematically shows an electronic apparatus in the form of a delay locked loop 100. A delay locked loop 100 comprises a signal input 110 which is used for receiving an input clock signal CLKin. The input clock signal CLKin is supplied to a delay line 120 which comprises a series circuit containing a plurality of homogeneous delay elements 122. The delay elements 122 are voltage-controlled delay elements. This means that the respective input signal's delay provided by one of the delay elements 122 is dependent on a control voltage VCTRL. In the example shown, each of the delay elements 122 essentially provides the same delay and is actuated by the same control voltage VCTRL. In other exemplary embodiments, however, it is possible for other types of control signals, for example digital control signals, to be used. In addition, the use of different delay elements in the delay line 120 is also conceivable.

In the example shown, the output of the delay elements 122 allows a respective appropriate phase signal P1 to P8 to be tapped off. In accordance with the position of the tap in the delay line 120, the phase signals P1 to P8 are delayed differently. On the basis of the homogeneous form of the delay elements 122, the phase signals P1 to P8 are at an even phase interval from one another. In the example shown, the delay line 120 contains eight of the delay elements 122, so that if the delay locked loop is locked to a delay of one clock cycle of the input clock signal CLKin, the phase interval between two adjacent phase signals P1 to P8 is ⅛ of a clock cycle. In other exemplary embodiments, it is possible for a larger or a smaller number of delay elements 122 to be used. Examples of this are explained further below with reference to FIGS. 5 and 6.

As illustrated, the delay locked loop 100 furthermore comprises a phase frequency detector (PFD) 150 which is supplied with the underlayed input clock signal CLKin and with a delayed output signal CLKdel from the delay line 120, in this case the phase signal P8. The phase frequency detector 150 is designed to use a comparison of signal edges of the input clock signal CLKin and of the output signal CLKdel from the delay line 120 to produce a first error signal UP and a second error signal DN. The first error signal UP and the second error signal DN control a charge pump (CHP) 160 which charges a loop filter capacitor 170. The loop filter capacitor 170 is coupled between an output of the charge pump 160 and a first prescribed circuit potential V0. By way of example, the first prescribed circuit potential V0 may be a low supply voltage or ground. The control voltage VCTRL is therefore formed by the voltage drop across the loop filter capacitor 170.

The first error signal UP is produced by the phase frequency detector 150 such that it prompts an increase in the control voltage VCTRL and hence a reduction in the delay which is provided by the individual delay elements 122 in the delay line 120. Conversely, the second error signal DN is produced such that it prompts a reduction in the control voltage VCTRL and hence an increase in the delay which is provided by the individual delay elements 122 in the delay line 120. A possible form of the phase frequency detector 150 is explained further below with reference to FIG. 4.

In order to sense a false lock state in the delay locked loop 100, the latter also comprises a register line comprising register elements 210. In the example shown, the register line comprises six register elements 210. The register elements 210 in the register line each comprise a data input (D), a data output (Q), a clock input and a reset input (R). The reset input can be used to put the register element 210 into a defined state, regardless of signal values at the data input or clock input. The reset input may therefore also be a Set input or the like. In the example shown, the register elements 210 are in the form of D-type flip-flops. In other exemplary embodiments, it is also possible for other types of register elements to be used, however.

In the example shown, a rising signal edge at the clock signal input of the register element 210 prompts a signal applied to the data input to be accepted and then held at the data output until a further rising signal edge at the clock input prompts a new signal value to be accepted or a reset signal at the reset input puts or resets the register element 210 into a defined state. It is again self-evident that the reset signal may also be a Set signal or the like.

The register elements 210 in the register line are connected in series such that the data input of the first register element 210 in the register line forms a data input for the register line, and the data output of the first register element 210 in the register line is coupled to the data input of the second register element 210 in the register line. The data output of the second register element 210 in the register line is coupled to the data input of the third register element 210 in the register line, the data output of the third register element 210 in the register line is coupled to the data input of the fourth register element 210 in the register line, the data output of the fourth register element 210 in the register line is coupled to the data input of the fifth register element 210 in the register line, and the data output of the fifth register element 210 in the register line is coupled to the data input of the sixth register element 210 in the register line. The data output of the sixth register element 210 in the register line forms the data output of the register line. The register elements 210 are therefore assembled to form the register line in the manner of a shift register such that the data output of one of the register elements 210 is coupled to the data input of a further one of the register elements 210.

In FIG. 1, Q1 denotes the signal at the data output of the first register element 210 in the register line, Q2 denotes the signal at the data output of the second register element 210 in the register line, Q3 denotes the signal at the data output of the third register element 210 in the register line, Q4 denotes the signal at the data output of the fourth register element 210 in the register line, Q5 denotes the signal at the data output of the fifth register element in the register line and Q6 denotes the signal at the data output of the sixth register element in the register line.

The register elements 210 in the register line are each associated with an appropriate delay element 122 and phase signal P1 to P8. As can be seen from the example shown, not every one of the phase signals P1 to P8 must have an associated register element 210, however. Thus, in the example shown, only the phase signals P1 to P6 have a corresponding associated register element 210 in the register line, whereas the phase signals P7 and P8 have no associated register element 210. The phase signals P1 to P6 are each associated with the clock input of the relevant register element 210.

Furthermore, the delay locked loop 100 comprises a frequency divider 230 and an inverter 240. The frequency divider 230 and the inverter 240 are coupled between the signal input 110 and the reset inputs of the register elements 210. The frequency divider 230 and the inverter 240 are used to derive first of all a frequency-divided clock signal CLKdiv and then a reset signal RST from the input clock signal CLKin. In the example shown, the frequency divider 230 has a division factor of 2. However, it is self-evident that in other exemplary embodiments it is also possible to use other division factors.

The reset signal RST produced by means of the frequency divider 230 and the inverter 240 is supplied to the reset inputs of the register elements 210 in the register line.

The data input of the register line, i.e. the data input of the first register element 210 in the register line, is coupled to a second prescribed circuit potential V1, e.g. at a high supply voltage. The second prescribed circuit potential V1 forms a fixed signal value for input into the register line.

In addition, the delay locked loop 100 comprises an evaluation register 220. The evaluation register 220 comprises a data input (D), a data output (Q) and a clock input. In the example shown, the evaluation register 220 is in the form of a D-type flip-flop. In other exemplary embodiments, however, it is also possible to use other registered types. Upon a rising signal edge at the clock input of the evaluation register 220, the signal value applied to the data input is accepted and is held at the data output until a further rising signal edge at the clock input prompts a new signal value to be accepted.

The data input of the evaluation register 220 is coupled to the data output of the register line, i.e. to the data output of the last register element 210. The data output of the evaluation register 220 produces a lock signal LCK which is supplied to the phase frequency detector 150. The lock signal LCK indicates whether there is a false lock state in the delay locked loop 100.

The way in which the register line works is as follows: the individual phase signals P1 to P6 prompt the signal value applied to the data input of the register line, i.e. the second circuit potential V1, to be shifted through the register line in the manner of a shift register until the end of the register line has been reached, where this signal value is then sensed by the evaluation register 220, or the register line is reset by means of the reset signal RST. Since the division factor of the frequency divider 230 is 2 in the present example, this means that the signal value applied to the data input of the register line is shifted to the data input of the evaluation register 220 only if the phase signals P1 to P6 are within one clock cycle of the input clock signal CLKin. However, this is not the case if the delay of the delay line 120 has been locked to be of such magnitude that it is a multiple of the clock cycle duration of the input clock signal CLKin. By using the evaluation register 220 to check whether the signal value is shifted through the register line to the end thereof, it is therefore possible to sense a false lock state in the delay locked loop 100. This can in turn be indicated by means of the lock signal LCK. Use of the evaluation register 220 ensures that the lock signal LCK does not fluctuate on account of initialization of the register line, but rather changes its value only when the false lock state is sensed afresh or is left again.

In the example shown, the last two phase signals P7 and P8 are not monitored by means of a register element 210 in the register line. In this way, the delay locked loop 100 is provided with an enlarged margin for control. Since the division factor of the frequency divider is 2, it is sufficient, for the purpose of sensing the false lock state, if only half of the phase signals P1 to P8, i.e. the phase signals P1 to P4, are monitored. In the false lock state, i.e. when the delay is twice the clock cycle duration of the input clock signal CLKin or more, no more than half of the phase signals P1 to P8, i.e. the phase signals P1 to P4, are within one clock cycle, however. By monitoring more than half of the phase signals P1 to P8, it is possible to increase the reliability of the sensing of the false lock state.

Figure 2:
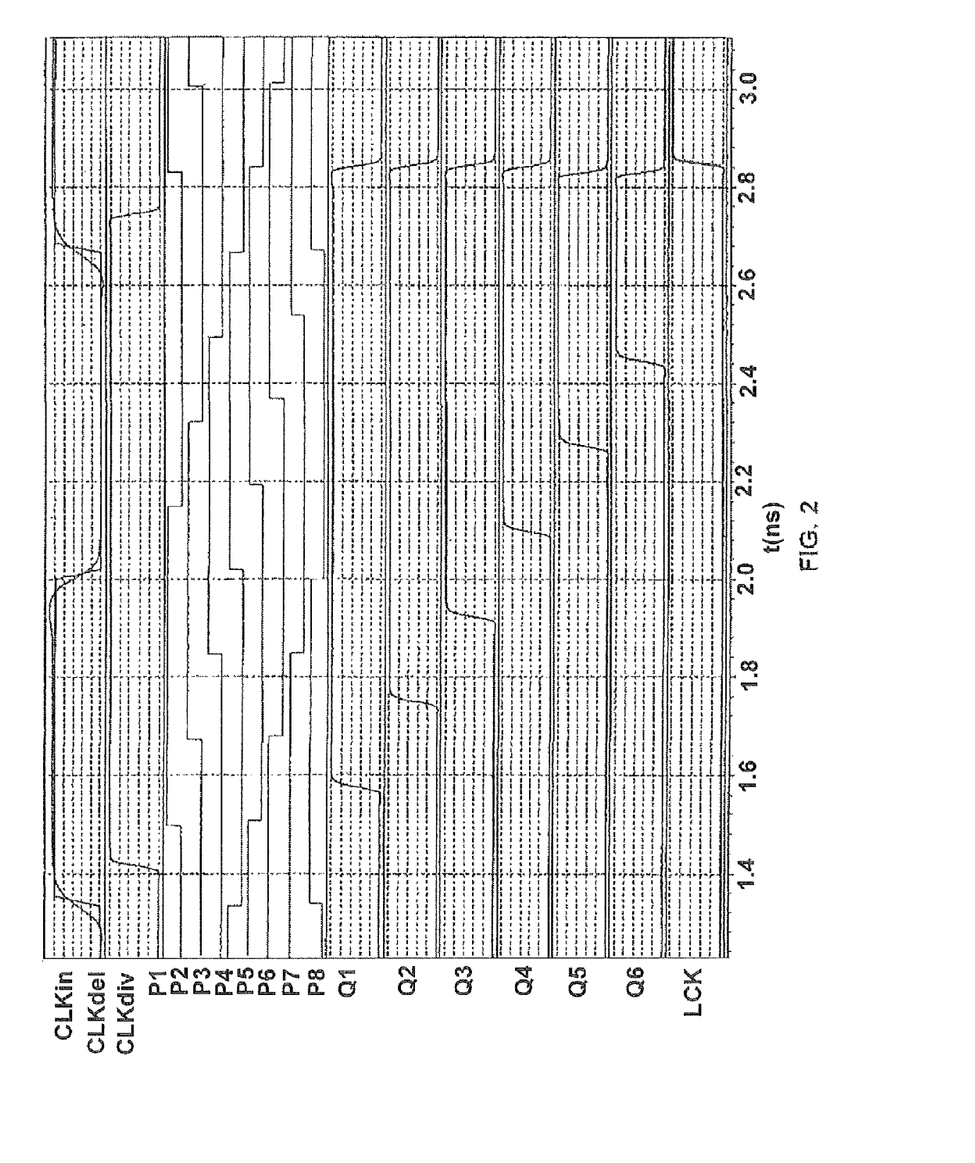
FIG. 2 shows exemplary signal profiles in the delay locked loop from FIG. 1.
Figure 3:
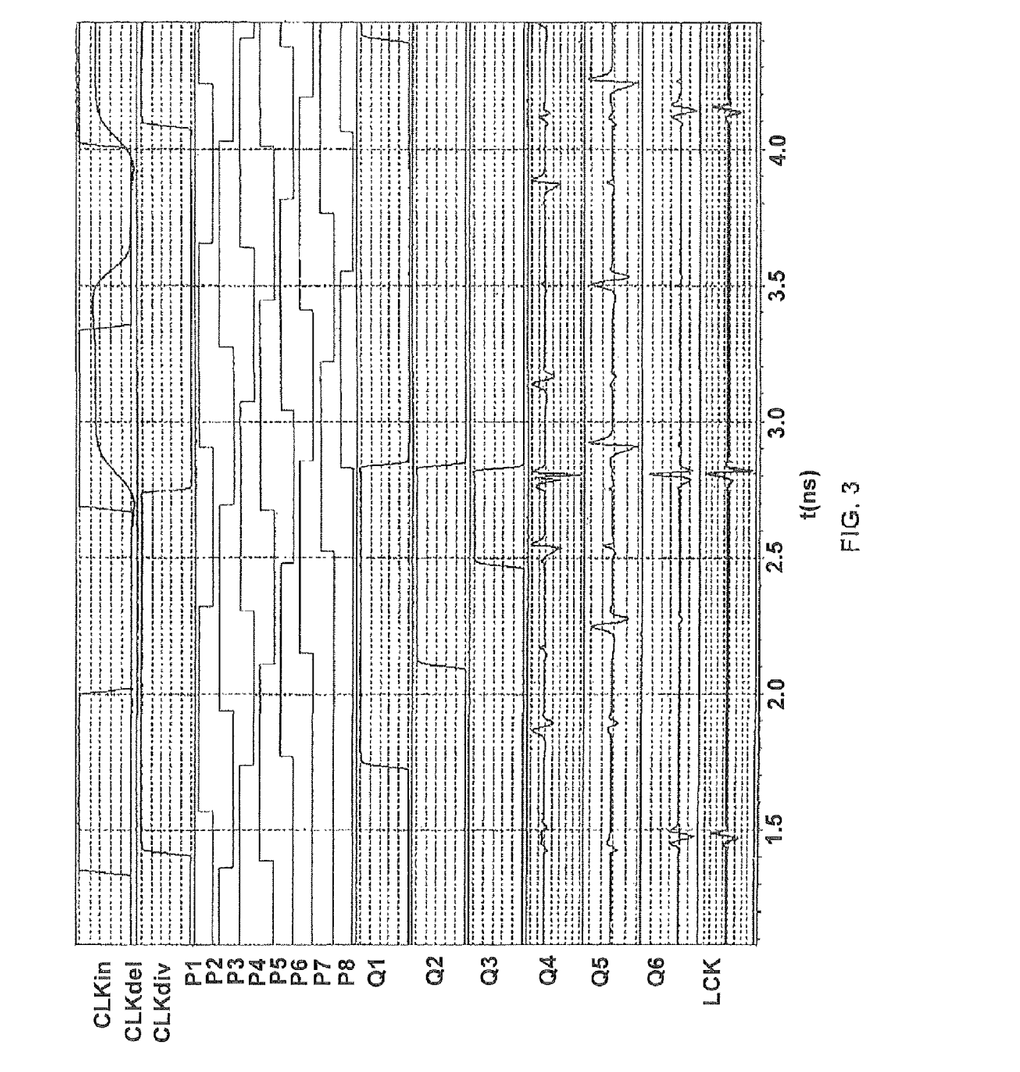
FIG. 3 shows further exemplary signal profiles in the delay locked loop from FIG. 1.

FIGS. 2 and 3 show exemplary signal profiles in a delay locked loop of the type illustrated in FIG. 1.

FIGS. 2 and 3 show the input clock signal CLKin and, overlaid thereon, the output clock signal CLKdel from the delay line 120 and also the frequency-divided clock signal CLKdiv. Furthermore, the positions of the phase signals P1 to P8 are schematically shown. In addition, FIG. 2 and FIG. 3 show the signals Q1 to Q6 at the data outputs of the register elements 210 in the register line and also the lock signal LCK.

The signal profiles in FIG. 2 are based on a correct lock state in the delay locked loop. That is to say that the delay line 120 provides a delay which corresponds to the clock cycle duration of the input clock signal CLKin. From the signals Q1 to Q6, it can be seen that the rising edge of the phase signal P1 involves a signal value which corresponds to the second prescribed circuit potential V1 entering the register line and being shifted to the data output of the register line within one clock cycle of the input clock signal CLKin. Accordingly, the evaluation register 220 also sets the lock signal LCK to this signal value at the beginning of the next clock cycle of the input clock signal CLKin.

By contrast, the signal profiles in FIG. 3 are based on a false lock state in the delay locked loop 100 and have the delay of the delay line 120 corresponding to approximately twice the clock cycle duration of the input clock signal CLKin. It can be seen that although the signal value corresponding to the second prescribed circuit potential V1 enters the register line upon the rising signal edge of the phase signal P1 in this case too, it does not reach the end of the register line. On the contrary, the register line is reset at the beginning of the next clock cycle of the input signal CLKin before the signal value has reached the end of the register line. In the example shown, the signal value is merely accepted to the third register element 210 in the register line, i.e. up to the signal Q3. The signals Q4, Q5, Q6 and the lock signal LCK remain essentially constant, for example at a low signal value which corresponds to the first prescribed circuit potential V0.

As FIG. 1 shows, the lock signal LCK can advantageously be used as an input signal for the phase frequency detector 150. On the basis of this input signal for the phase frequency detector 150, the first error signal UP and the second error signal DN can be produced such that the delay is reduced so long as the lock signal LCK indicates the false lock state in the delay locked loop 100. An example of an appropriate form of the phase frequency detector 150 is shown in FIG. 4.

Figure 4:
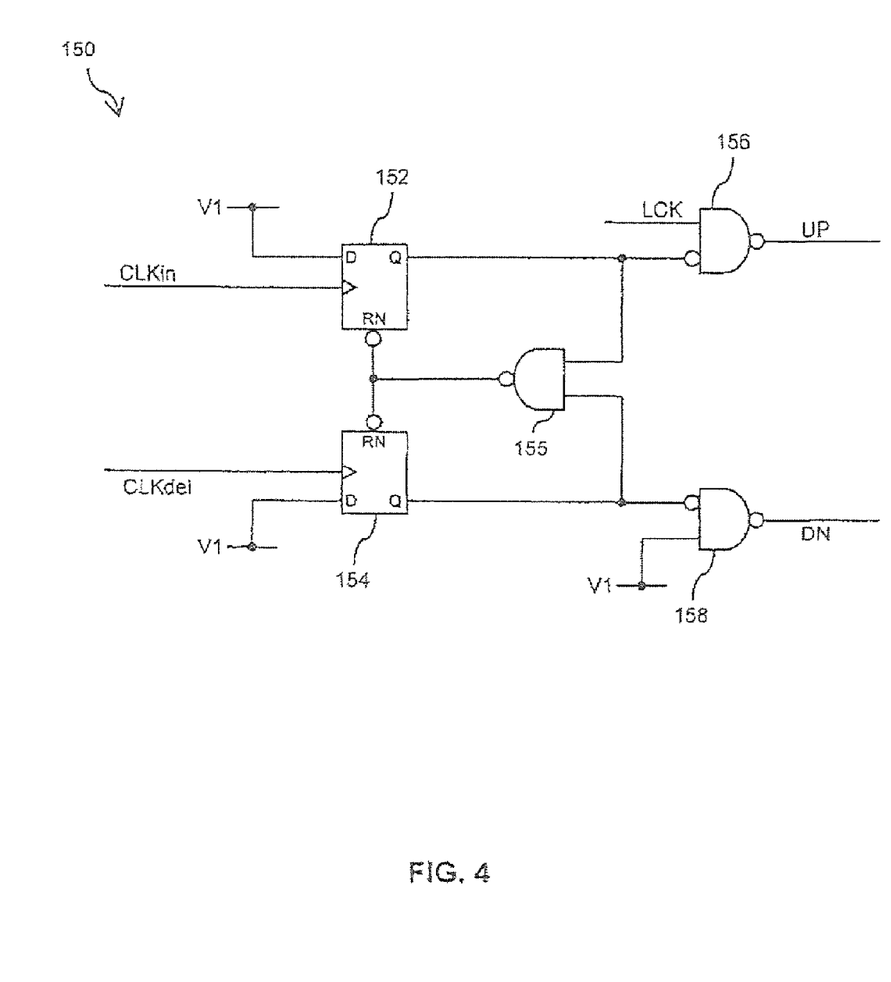
FIG. 4 schematically shows a phase frequency detector for a delay locked loop in accordance with an exemplary embodiment of the invention.

The phase frequency detector 150 shown in FIG. 4 is based essentially on a known type 4 phase frequency detector and comprises a first register element 152 and a second register element 154. The register elements 152 and 154 each comprise a data input (D), a data output (Q) and a clock input. In addition, the register elements 152, 154 each comprise an inverting reset input (RN). The respective data input of the register elements 152, 154 is connected to the second prescribed circuit potential V1. The clock input of the first register element 152 is supplied with the input clock signal CLKin. The clock input of the second register element 154 is supplied with the delayed input clock signal, i.e. the output signal for the delay line CLKdel. Furthermore, the phase frequency detector 150 comprises a reset logic gate 155 which is in the form of a NAND gate. A first input of the reset logic gate 155 is connected to the data output of the first register element 152, and a second input of the reset logic gate 155 is connected to the data output of the second register element 154. The output of the reset logic gate is connected to the inverting reset inputs of the register elements 152, 154.

In addition, the phase frequency detector 150 comprises a first logic gate 156 which is in the form of a NAND gate and which has an inverting first input coupled to the data output of the first register element 152. A noninverting second input of the first logic gate 156 is supplied with the lock signal LCK. The output of the first logic gate 156 produces the first error signal UP.

In addition, the phase frequency detector 150 comprises a second logic gate 158 which is in the form of a NAND gate and which has an inverting first input coupled to the data output of the second register element 154. A noninverting second input of the second logic gate 158 is coupled to the second prescribed circuit potential V1. The output of the logic gate 158 produces the second error signal DN.

The way in which the phase frequency detector 150 shown in FIG. 4 works is such that the first error signal UP is produced so long as the lock signal LCK indicates that there is a false lock state in the delay locked loop 100. If there is no false lock state in the delay locked loop 100, the first error signal UP and the second error signal DN are produced in accordance with a normal standard manner of operation for the phase frequency detector 150, i.e. the first error signal UP is produced if the adjusted delay is too great, and the second error signal DN is produced if the adjusted delay is too small. In this case, it is self-evident that the second logic gate 158 could also be omitted. The provision of the second logic gate 158 is regarded as advantageous, however, since this achieves symmetry for the signal path for the production of the first error signal UP and for the signal path for the production of the second error signal DN.

Figure 5:
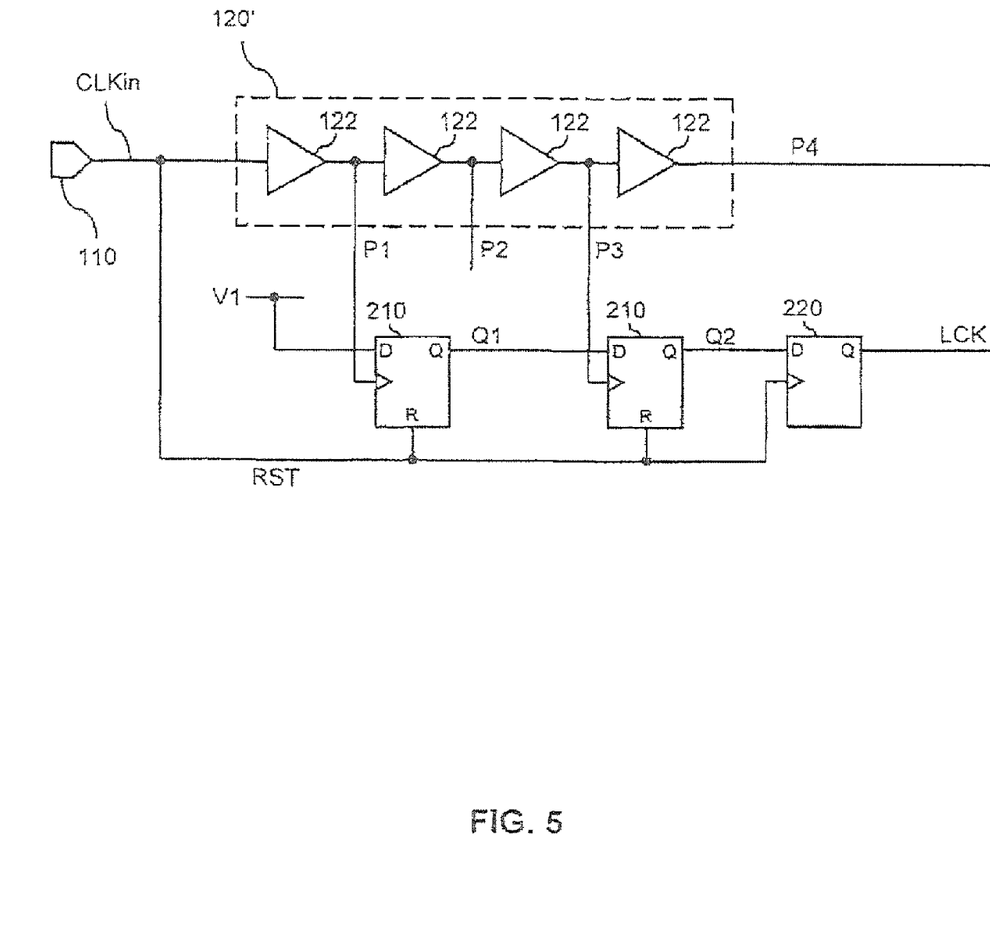
FIG. 5 schematically shows a circuit for sensing a false lock state in accordance with a further exemplary embodiment of the invention.
Figure 6:
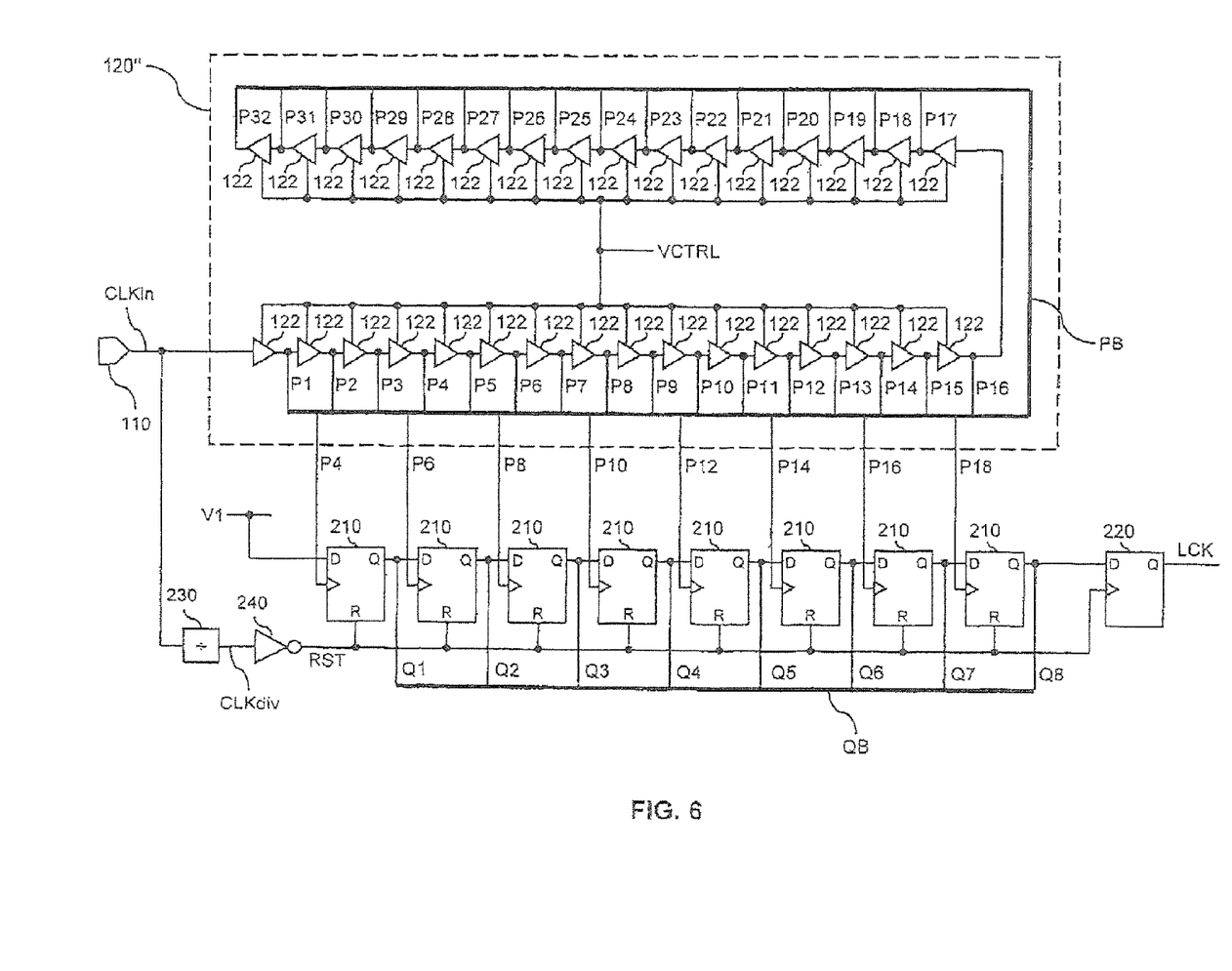
FIG. 6 schematically shows a circuit for sensing a false lock state in accordance with a further exemplary embodiment of the invention.

The designs explained with reference to FIGS. 1 to 3 in relation to the sensing of the false lock state can be modified in various ways. Thus, by way of example, a larger number of delay elements 122 or a smaller number of delay elements 122 can be used in the delay line 120. In addition, the register line may also comprise a larger or smaller number of register elements 210. Furthermore, it may also be advantageous for there to be a respective particular number of unmonitored phase signals between the monitored phase signals, so that only every second phase signal is monitored, for example. In this way, it is possible to avoid problems on account of excessively short signal propagation times between adjacent delay elements 122 in comparison with setup times for the register elements 210. Furthermore, implementations in which the frequency divider 230 and/or the inverter 240 is dispensed with are also conceivable. Appropriate examples are explained in FIGS. 5 and 6. FIGS. 5 and 6 explain components which correspond to those from FIG. 1 with the same reference symbols. Details concerning these components can therefore be taken from the relevant description in connection with FIG. 1. Only the differences in comparison with FIG. 1 are explained below.

FIG. 5 shows a delay line 120' which contains four delay elements 122. The respective output of the delay elements 122 allow phase signals P1, P2, P3 and P4 to be tapped off.

The register line comprises two register elements 210. The data input of the first register element 210 in the register line forms the data input of the register line. The data output of the first register element 210 in the register line is coupled to the data input of the second register element 210 in the register line. The data output of the second register element 210 in the register line forms the data output of the register line. The signal at the data output of the first register element 210 in the register line is denoted by Q1, and the signal at the data output of the second register element 210 in the register line is denoted by Q2.

The first register element 210 in the register line is associated with the phase signal P1. The phase signal P1 is supplied to the clock input of the first register element 210 in the register line. The second register element 210 in the register line is associated with the phase signal P3. The phase signal P3 is supplied to the clock input of the second register element 210 in the register line.

Furthermore, the frequency divider 230 and the inverter 240 have been omitted in the apparatus shown in FIG. 5.

The manner of operation for the apparatus in FIG. 5 is similar to that in FIG. 1. In this case too, a signal value corresponding to the second prescribed circuit potential V1 is accepted into the register line upon the rising signal edge of the phase signal P1. If the delay of the delay line 120' is too great, e.g. is twice the clock cycle duration of the input clock signal CLKin or more, this signal value is no longer accepted into the second register element 210 in the register line. The evaluation using the evaluation register 220 is in turn performed as explained for FIG. 1.

FIG. 6 shows a delay line 120" with 32 delay elements 122. The respective output of the delay elements 122 allows phase signals P1 to P32 to be tapped off. The phase signals P1 to P32 are combined to form a phase bus PB. In addition, the apparatus in FIG. 6 has eight register elements 210 provided in the register line. The register line from FIG. 1 has therefore also had a seventh register element 210 and an eighth register element 210 added to it. The data output of the sixth register element 210 is coupled to the data input of the seventh register element 210, and the data output of the seventh register element 210 is coupled to the data input of the eighth register element 210. The data output of the eighth register element 210 forms the data output of the register line. The signal at the data output of the seventh register element is denoted by Q7, and the signal at the data output of the eighth register element is denoted by Q8. The signals at the respective data outputs of the register elements 210 are combined to form a signal bus PB.

In the apparatus in FIG. 6, the first register element 210 in the register line is associated with the phase signal P4. The phase signal P4 is supplied to the clock input of the first register element 210 in the register line. The second register element 210 in the register line is associated with the phase signal P6. The phase signal P6 is supplied to the clock input of the second register element 210 in the register line. The third register element 210 in the register line is associated with the phase signal P8. The phase signal P8 is supplied to the clock input of the third register element 210 in the register line. The fourth register element 210 in the register line is associated with the phase signal P10. The phase signal P10 is supplied to the clock input of the fourth register element 210 in the register line. The fifth register element 210 in the register line is associated with the phase signal P12. The phase signal P12 is supplied to the clock input of the fifth register element 210 in the register line. The sixth register element 210 in the register line is associated with the phase signal P14. The phase signal P14 is supplied to the clock input of the sixth register element 210 in the register line. The seventh register element 210 in the register line is associated with the phase signal P16. The phase signal P16 is supplied to the clock input of the seventh register element 210 in the register line. The eighth register element 210 in the register line is associated with the phase signal P18. The phase signal P18 is supplied to the clock input of the eighth register element 210 in the register line.

In the apparatus in FIG. 6, every second phase signal beginning with the phase signal P4 and ending with the phase signal P18 is therefore monitored by an appropriate register element 210 in the register line. In the correct lock state of the phase locked loop, the delay in one of the delay elements 122 may be approximately 125 ps, for example. Since only every second phase signal is monitored by one of the register elements 210, it is possible to avoid problems on account of setup times for the register elements 210, which may be in the same order of magnitude.

In a similar manner to that for the apparatuses from FIG. 1 and FIG. 5, the apparatus in FIG. 6 also involves the signal value which corresponds to the second prescribed circuit potential V1 being shifted to the data output of the register line only if the delay of the delay line 120" has not been adjusted to be too great. In the case of a delay which corresponds to twice the clock cycle duration of the input clock signal CLKin or more, the signal value does not reach the end of the register line. This is sensed by the evaluation register 220 as explained in connection with FIG. 1.

Figure 7:
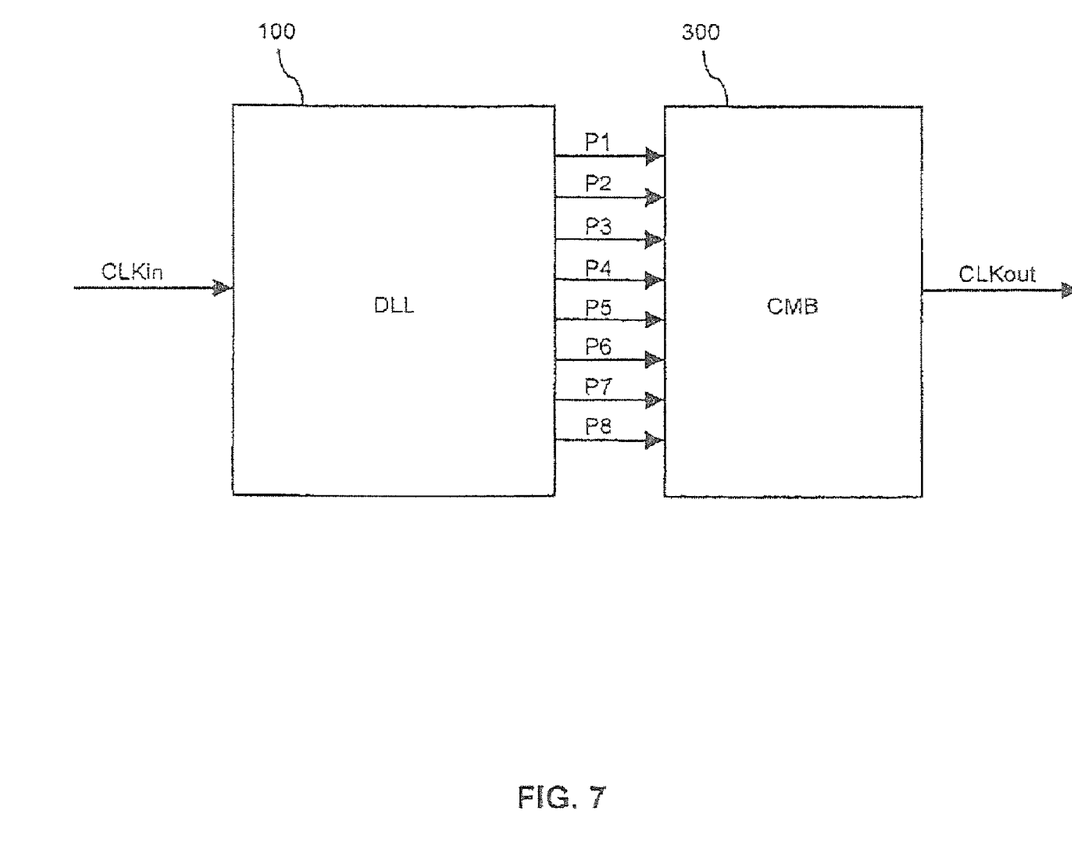
FIG. 7 schematically shows an apparatus for producing an output clock signal in accordance with an exemplary embodiment of the invention.

FIG. 7 schematically shows an apparatus for producing an output clock signal CLKout from an input clock signal CLKin. The apparatus comprises a delay locked loop (DLL) 100 which is based on the designs explained with reference to FIGS. 1 to 6. The delay locked loop 100 delivers phase signals P1 to P8. In this case, it is self-evident that it is also possible for a smaller or a larger number of phase signals to be provided, depending on the implementation of the delay locked loop 100. Furthermore, the apparatus comprises a combiner 300 which is supplied with the phase signals P1 to P8. The combiner 300 prompts suitable combination of the phase signals P1 to P8 in order to produce the output clock signal CLKout. By way of example, the combination may comprise a selection of at least one of the phase signals P1 to P8, mixture of two or more phase signals, interpolation of two or more phase signals or the like. In this way, the output clock signal CLKout can be produced with a different frequency and/or a different phase angle than the input signal CLKin.

Figure 8:
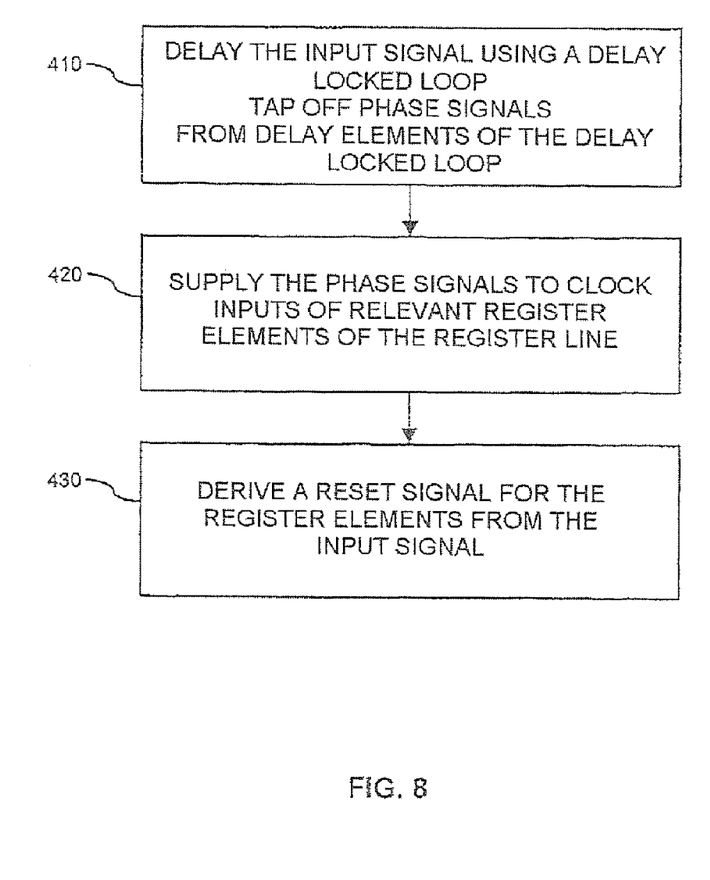
FIG. 8 shows a flowchart to illustrate a method in accordance with an exemplary embodiment of the invention.

FIG. 8 uses a flowchart to illustrate a method for the controlled delay of an input signal. By way of example, the method can be performed using the delay locked loop explained with reference to FIGS. 1 to 6.

In step 410, the input signal is delayed by means of a delay locked loop. Differently delayed phase signals are tapped off from delay elements in the delay locked loop.

In step 420, the phase signals are supplied to clock inputs of appropriate register elements in the register line.

In step 430, a reset signal is derived from the input signal and is supplied to reset inputs of the register elements. The lock state of the delay locked loop can then be determined from the output signal from the register line. This can be done using an evaluation register, for example, as is illustrated in FIGS. 1, 5 and 6.

It is self-evident that various kinds of modifications are possible in the designs described above. By way of example, instead of using a control voltage to control the delay elements, a different kind of control signal can be used, e.g. a control current or a digital control signal. In addition, the number of delay elements in the delay line can be chosen on the basis of the requirements of the application. Furthermore, there are various options for the selection of the number of register elements in the register line and the association thereof with the phase signals which are to be monitored. Additionally, it is self-evident that the signal profiles and signal forms shown by means of FIGS. 2 and 3 are merely illustrative and exemplary, and that different signal profiles and signal forms may arise in other implementations or under other conditions.

The invention claimed is:

1. An electronic apparatus, comprising:
a signal input configured to receive an input signal;
a delay line configured to delay the input signal, wherein the delay line comprises at least two delay elements, the outputs of which allow differently delayed phase signals to be tapped off therefrom; and
a register line, wherein the register line comprises, for at least some delay elements, a respective register element comprising a reset input and a clock input,
wherein the reset inputs are each coupled to the signal input, and
wherein the outputs of the at least some delay elements are respectively coupled to the clock input of the respective register elements.

2. The apparatus of claim 1,
wherein the register elements each comprise a data input and a data output, and
wherein the data output of one of the register elements is coupled to the data input of a further one of the register elements.

3. The apparatus of claim 1,
wherein the register elements each comprise a D-type flip-flop.

4. The apparatus of claim 1, further comprising:
a frequency divider coupled between the signal input and the reset inputs of the register elements.

5. The apparatus of claim 1,
wherein a data input of the register line is coupled to a prescribed circuit potential.

6. The apparatus of claim 1,
wherein the delay line comprises at least one further delay element that has no associated register element in the register line.

7. The apparatus of claim 1, further comprising:
an evaluation register comprising a data input, a data output and a clock input, wherein a data output of the register line is coupled to the data input of the evaluation register, and wherein the clock input of the evaluation register is coupled to the signal input.

8. The apparatus of claim 7, wherein the evaluation register comprises a D-type flip-flop.

9. The apparatus of claim 7, wherein the evaluation register is configured to provide a lock signal at the data output thereof that indicates whether there is a false lock state in the delay provided by the delay line.

10. The apparatus of claim 9, further comprising:
a phase frequency detector configured to receive the input signal, a delayed output signal from the phase locked loop, and the lock signal.

11. The apparatus of claim 10, wherein the phase frequency detector is configured to produce a first error signal and a second error signal, wherein the first error signal prompts a reduction in the delay of the delay line and the second error signal prompts an increase in the delay of the delay line.

12. The apparatus of claim 11, wherein the phase frequency detector is configured to produce the first error signal as long as the lock signal indicates that there is the false lock state.

13. The apparatus as claimed in claim 12, wherein the phase frequency detector comprises a first logic gate and a second logic gate, wherein the lock signal is supplied to an input of the first logic gate and the first error signal is formed by an output signal from the first logic gate, and wherein the second error signal is formed by an output signal from the second logic gate.

14. A method, comprising:
delaying an input signal with a delay locked loop, wherein the delay locked loop comprises a delay line with at least two delay elements which allow differently delayed phase signals to be tapped off therefrom;
providing a register line, wherein the register line comprises, for at least some of the delay elements, a respective register element comprising a reset input and a clock input;
deriving a reset signal from the input signal and supplying the reset signal to the reset inputs of the register elements; and
supplying the phase signals from the delay elements to the clock input of the respective register elements.

15. The method of claim 14, comprising:
producing a lock signal based on an output signal from the register line, wherein the lock signal indicates whether there is a false lock state in the delay locked loop.

16. The method of claim 15, comprising:
producing a first error signal that prompts a reduction in the delay of the delay line; and
producing a second error signal that prompts an increase in the delay of the delay line,
wherein the first error signal is produced as long as the lock signal indicates that there is the false lock state.

17. The method of claim 14, further comprising:
coupling a data input of the register line to a prescribed circuit potential.

18. The method of claim 14,
wherein the reset signal is derived by frequency division of the input signal.

19. The method of claim 14,
wherein the delay locked loop comprises at least one further delay element which has no associated register element in the register line.

20. The method of claim 14, further comprising:
producing an output signal based on at least one phase signal from the delay locked loop.

* * * * *